March 21, 1961 A. A. VALDETTARO 2,976,375

HIGH FREQUENCY TUNER

Filed April 9, 1958

INVENTOR.

ALARICO A. VALDETTARO

BY

Mason, Kolehmainen, Rathburn and Wyss.

ATTORNEYS.

United States Patent Office 2,976,375

Patented Mar. 21, 1961

2,976,375

HIGH FREQUENCY TUNER

Alarico A. Valdettaro, Bloomington, Ind., assignor to Sarkes Tarzian, Inc., Bloomington, Ind., a corporation of Indiana Filed Apr. 9, 1958, Ser. No. 727,301

10 Claims. (Cl. 200—14)

The present invention relates to high frequency tuners and more particularly to the mechanical design of television tuners.

Prior art VHF television tuners of the switch type generally comprise a plurality of switch wafers which are fixedly mounted in a supporting chassis and on which a plurality of incremental inductances are supported for selective connection to the associated electric circuit. In order to prevent spurious detuning of the receiver, it is important that these wafers do not move with respect to one another or with respect to the chassis, and therefore, it has been customary to mount these wafers on two or more insulated supporting rods which are secured to the chassis and extend through all of the wafers. Moreover, suitable insulating spacer sleeves are ordinarily positioned on these rods between the wafers to maintain the wafers at fixed axial positions with respect to one another. While this construction is structurally sound and maintains the switch wafers in the desired positions, the wafers are difficult to assemble to the chassis during the initial fabrication of the tuner, and should one of the wafers have to be replaced in a completed tuner, a major disassembly of the entire tuner is necessary.

Therefore, a principal object of the present invention is to provide a new and improved high frequency tuner which may be easily and quickly assembled.

Another object of the present invention is to provide a new and improved high frequency tuner employing mechanical supporting members which are susceptible to facile assembly into a complete unit.

A further object of the present invention is to provide a VHF television tuner which employs switch wafers which may be individually assembled in the chassis.

Another object of the present invention is to provide a VHF television tuner which may be manufactured at a relatively low cost and which may be easily repaired when necessary.

Briefly, the above and further objects are realized in accordance with the present invention by providing a tuner which comprises a plurality of switch wafers which are individually held in place in the supporting chassis by a novel snap-in arrangement. In this construction the switch wafers may be individually mounted in the chassis and in the event that repair or replacement of one of the wafers becomes necessary, that wafer may be readily removed from the chassis without removing all of the other wafers therefrom.

The invention, both as to its organization and method of operation, together with further objects and advantages thereof, will best be understood by reference to the following detailed description taken in connection with the accompanying drawing, in which.

Figures 1, 2, 3, 4, 5:
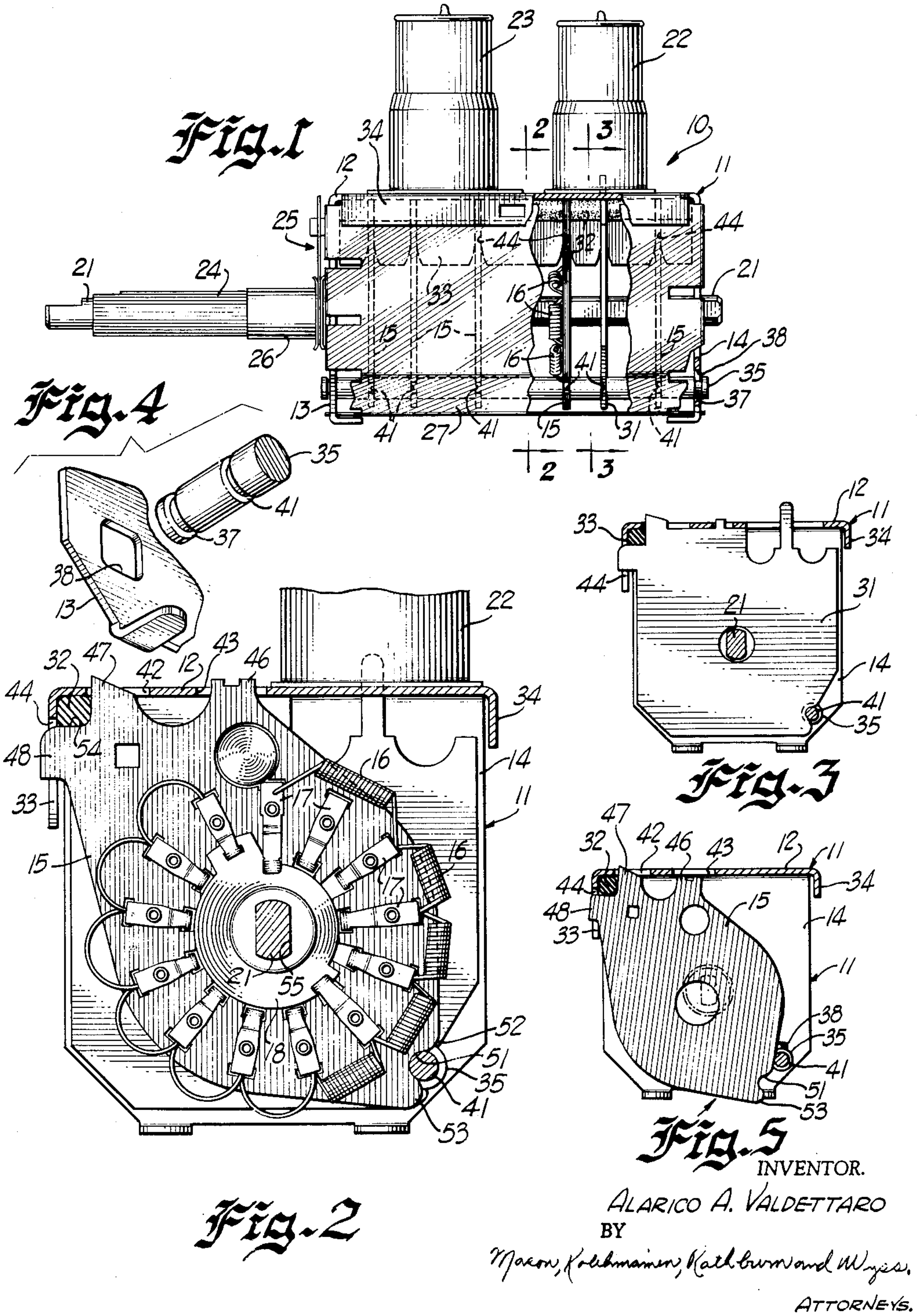
Fig. 1 is a fragmentary elevational view of a high frequency tuner embodying the present invention.
Fig. 2 is a sectional view taken along the line 2—2 of Fig. 1.
Fig. 3 is a sectional view taken along the line 3—3 of Fig. 1.
Fig. 4 is a fragmentary perspective view illustrating the manner in which an indexing tie bar is secured in place in the chassis.
Fig. 5 is a sectional view similar to Fig. 2 illustrating an individual switch wafer being mounted in the chassis.

Referring now to the drawings, there is shown a VHF television tuner 10 comprising a supporting chassis 11 formed by a deck 12 having a pair of end walls 13 and 14 respectively depending from the front and rear ends thereof. A plurality of switch wafers 15 are mounted beneath the deck 12 in spaced apart parallel relationship with respect to the end walls 13 and 14, and each of the wafers supports a plurality of incremental inductances 16 which are electrically connected to a plurality of respective stationary contact segments 17 on the wafers 15. Since the particular construction of the operative portions of the switches mounted on the switch wafers 15 does not constitute a part of the present invention, a detailed description thereof is not included herein. Very briefly, however, in order to facilitate an understanding of the present invention, a plurality of conductive wipers 18 are journaled in the wafers 15 and are adapted to be rotated by a channel selector shaft 21 which extends out from the front of the tuner 10. The angular position of orientation of the shaft 21 thus determines the ones of the inductances which are connected to the other circuits of the tuner. These other circuits include a shielded RF amplifier tube 22 and a shielded RF oscillator-mixer tube 23 mounted on top of the deck 12. The tuner 10 further comprises a vernier tuning control shaft 24 which is concentrically mounted with respect to the channel selector shaft 21 and which enables manual adjustment of a suitable vernier tuning capacitor 25 which is connected in the circuit of the oscillator-mixer tube 23 for precisely controlling the frequency of oscillation thereof. The channel selector shaft 21 is journaled near the front end thereof in the vernier tuning shaft 24 which itself is rotatably mounted in a sleeve bearing 26 extending from the front wall 13 of the tuner 10, and the shaft 21 is journaled near its rearward end in the rear chassis wall 14.

In order to shield the various tuned circuit elements of the tuner 10 from the other circuits in the associated receiver, there is provided a shield 27 which cooperates with the deck 12 and the front and rear chassis walls 13 and 14 to provide within the chassis 11 a completely shielded area in which the switch wafers 15 and other circuit components of the tuner 10 are housed.

In order to mount the switch wafers 15 and a shielding plate 31 in the chassis 11, a resilient strip 32 is disposed in one corner of the chassis member 11 defined by the deck 12 and a depending side flange 33. A similar flange 34 depends from the opposite side of the tuner and in accordance with well known techniques these flanges are used to strengthen the deck 12 and to provide means for securing the shield 27 to the chassis 11. As shown in Fig. 2, the tubes 22 and 23 are mounted along the edge of the deck 12 which is remote from the flange 33 and an indexing tie rod 35 extends between the end walls 13 and 14 at locations diametrically opposite the location of the resilient strip 32. Therefore, as shown in Fig. 2, the indexing rod 35 is disposed directly beneath the tubes 22 and 23. As best shown in Figs. 1 and 4, the indexing rod 35 is provided with annular grooves 37 near the ends thereof and the end walls 13 and 14 are respectively provided with square holes 38 through which the rods 35 may be passed. With the rod 35 in the position illustrated in Fig. 1, the grooves 37 are adjacent to the walls 13 and 14 and since the widths of the grooves 37 exceed the respective thicknesses of the end walls 13 and 14, portions of the walls 13 and 14 which partially define the holes 38 may be received in the grooves 37 thereby to prevent axial movement of the rod 35 with respect to the chassis 11. The indexing rod 35 is also provided with a plurality of annular indexing grooves 41 which are respectively disposed at the desired locations of the switch wafers 15 and of the shielding plate 31. These grooves each have a thickness which is slightly greater than the thickness of the wafers 15 and of the shielding plate 31, and the deck 12 is provided with a plurality of sets of elongated apertures 42 and 43 which have a thickness slightly greater than the thickness of the wafers 15 and the shielding plate 31 and which are positioned in the desired planes of the switch wafers 15. The flange 33 is also provided with a plurality of elongated slots 44 which are respectively disposed in the planes of the sets of apertures 42 and 43 and the switch wafers 15 and the shielding plate 31 are provided with a plurality of protruding tab-like portions which are received in the apertures 42 and 43 and in the slots 44.

Considered in greater detail, and referring to Fig. 2, the switch wafers 15 each include a tab 46 which is received in the aperture 43, a tab 47 which is received in the aperture 42, and a tab 48 which is received in the slots 44. In assembling the switch wafers 15 to the chassis 11, the resilient member 32 is first placed in the position shown in Fig. 2, and as shown in Fig. 5, the wafers 15 to which the incremental inductance elements 16 have previously been connected are individually moved into place toward the corner defined by the flange 33 and the deck 12 so that the tabs 46, 47, and 48 are partially received in the associated apertures in the chassis. The lower end of each wafer 15 is provided with an arcuate locking recess 51 having a radius substantially equal to the radius of the bottom portions of the groove 41 and has a curved camming portion 52 on the upper side thereof which smoothly adjoins the recess 51. In addition, the wafers 15 each have a curved stop portion 53 adjacent the recess 51 on the opposite side from the camming portion 52. The maximum dimension between the stop 53 and the upper ends of the wafers which adjoin the corner between the deck 12 and flange 33 are greater than the distance between that corner and the bar 35 so that the wafers 15 cannot be rotated counterclockwise past the bar 35 when being assembled. The maximum dimension between the camming portion 52 and a notch 54 formed in the upper end of each wafer 15 by the tabs 47 and 48 is less than the distance between the corner and the rod 35 but greater than the distance between the rod 35 and the uncompressed resilient member 32. Accordingly, with the switch wafer in the position shown in Fig. 5, it may be pressed upwardly in the direction indicated by the arrow toward the indexing rod 35, thereby to pivot it counterclockwise about its upper end and to compress the resilient member 32 as the locking portion 51 moves into the associated indexing groove 41. When the portion 51 is directly opposite the groove 41, the resilient member 32 presses the switch wafer toward the groove thereby to secure the wafer in place as best shown in Fig. 2. As there shown, the member 32 is partially compressed in the completed assembly. The shielding plate 31 is similarly assembled into the chassis 11. Axial movement of the wafers 15 and of the shielding plate 31 is thus prevented by the indexing grooves 41 in the indexing rod 35 and by the apertures 42, 43, and 44 in the chassis 11.

After the switch wafers have thus been assembled, the necessary electrical connections from the switches to the other circuit elements in the tuner may be made. Moreover, by a proper control of the dimensions of the chassis 11 and of the wafer 15, a plurality of central double D apertures 55 respectively provided in the switch wafers 15 are aligned so that the channel selector shaft 21 may be readily inserted from the front of the tuner through all of the wafers.

When and if it becomes desirable to replace one of the wafers, this may be readily accomplished by merely withdrawing the channel selector shaft 21 from the tuner, unsoldering any electrical connections from the particular wafer in question to the associated circuit and then pressing the particular wafer 15 toward the resilient strip 32 while pivoting it clockwise as viewed from the front of the tuner. A new wafer may then be readily inserted into the unit in the same manner in which the wafers are initially assembled into a new tuner and the necessary electrical connections made thereto.

It may thus be seen that the present invention provides a high frequency tuner which may be readily assembled and in which the switch wafers may be easily removed for repair or replacement when necessary.

While particular embodiments of the invention have been shown, it will be understood, of course, that it is not desired that the invention be limited thereto since modifications may be made, and it is, therefore, contemplated by the appended claims to cover any such modifications as fall within the true spirit and scope of the invention.

Having thus described the invention, what is claimed as new and desired to be secured by Letters Patent of the United States is:

1. In a high frequency tuner, the combination of a chassis having a deck, a pair of end walls depending from said deck, a tie rod connected between said walls, said rod being remotely disposed from said deck, an elongated resilient strip disposed beneath and adjacent to said deck, and a plurality of switch wafers disposed between said strip and said rod, said strip and said rod engaging said switch wafers at diametrically spaced points thereon, said strip being partially compressed whereby said wafers are pressed against said rod and yet may be readily removed without removal of said tie rod.

2. In a high frequency tuner, the combination of a chassis including intersecting portions forming a corner, a resilient member disposed in said corner, said chassis further including a member remotely disposed from said corner, and a switch wafer disposed between said resilient member and said remotely disposed member and having notches in diametrically opposed edges thereof which are adapted to engage said resilient member and said remotely disposed member, the dimension of said wafer between said members being such that said resilient member is partially compressed and thus presses said wafer into engagement with said remotely disposed member, said resilient member having sufficient resiliency to permit removal of said wafer without moving said tie bar.

3. In a tuner, a chassis member comprising a deck, depending front and rear end walls and a depending side flange, a channel selector shaft journaled in said walls and lying parallel to the plane of said deck, a plurality of switches each including a rotor portion rotatably mounted on a stator portion, said shaft extending through the rotors of said switches for simultaneous operation of all of said switches, and means for mounting said stators in spatially arranged positions on said chassis, said means comprising an indexing tie bar connected between said walls near the marginal ends thereof, a plurality of indexing grooves in said tie bar, said grooves being spaced apart by predetermined amounts, a plurality of apertures in said deck in proximity to said flange, said apertures being spaced apart by distances equal to the spacing between said indexing grooves, protruding portions on said stators for respective reception in said apertures, each of said stators having notches disposed at the opposite ends thereof, one of said notches on each of said stators being proximately disposed with respect to the protruding portion on the respective stator, said one notch on each stator being adjacent the junction of said deck and said flange and the others of said notches receiving said tie bar at the respective locations of said indexing grooves, and a resilient member disposed in the corner formed by said deck and said flange and partially received in said one notches of said stators, whereby said stators are resiliently pressed into engagement with said tie bar and thereby secured to said chassis.

4. The combination set forth in claim 3 wherein said tie bar is loosely disposed in apertures in said end walls, said bar being provided with annular grooves at the locations of said end walls.

5. In a tuner, a chassis including spaced apart portions, an indexing member connected between said portions, a plurality of planar members, said planar members each being notched at one end for receiving said indexing member, and resilient means interposed between said chassis and said planar members for urging said planar members into engagement with said indexing member.

6. The combination set forth in claim 5 wherein each of said planar members is provided with a correspondingly disposed, substantially central aperture, and a shaft extends through said apertures.

7. In a tuner, an indexing member, a resilient member, said members being spaced apart with the principal axes thereof mutually parallel, and a plurality of switch wafers arranged in spaced apart parallel relationship, each of said wafers being interconnected between said members with said resilient member in at least partial compression.

8. The combination set forth in claim 7 wherein said indexing member is a cylindrical bar, and said wafers each have a recess in one end for reception of said bar.

9. In a tuner, a chassis, an indexing bar, a resilient member held throughout its length by means of said chassis, said bar and said member being spaced apart with the principal axis thereof mutually parallel, and a plurality of switch wafers arranged in spaced apart relationship, each of said wafers being interposed between said bar and said resilient member in juxtaposition with said bar and said member with said resilient member in at least partial compression, said wafers each having a convex camming portion adjacent to a recess in one end thereof for reception of said bar thereby to facilitate insertion of said wafers between said bar and said resilient members, the maximum dimension of each of said wafers between said convex portion and the portion thereof which engages said resilient member being less than the distance between said bar in said chassis and the portion of said chassis against which said resilient member is disposed, and greater than the distance between said bar and said resilient member when said resilient member is uncompressed.

10. The combination set forth in claim 9 wherein said wafer is provided with a stop portion adjacent to said recess on the opposite side thereof from said convex portion, said stop portion being displaced from said resilient member engaging portion of said wafer by a distance exceeding the distance between said indexing member and said rigid member.

References Cited in the file of this patent

UNITED STATES PATENTS

| | | |
|---|---|---|
| 2,562,437 | Rothwell | July 31, 1951 |
| 2,644,063 | Zikmund et al. | June 30, 1953 |
| 2,801,377 | Selbman | July 30, 1957 |
| 2,817,723 | Allison | Dec. 24, 1957 |
| 2,841,660 | Tabet | July 1, 1958 |

UNITED STATES PATENT OFFICE
CERTIFICATE OF CORRECTION

Patent No. 2,976,375 March 21, 1961

Alarico A. Valdettaro

It is hereby certified that error appears in the above numbered patent requiring correction and that the said Letters Patent should read as corrected below.

Column 5, line 7, beginning with "5. In a tuner, a chassis" strike out all to and including "reception of said bar.", in line 26, same column, comprising claims 5 to 8, inclusive; same column 5, line 27, for "9." read -- 5.--; column 6, line 16, for "10." read -- 6. --; same line 16, for the claim reference numeral "9" read -- 5 --; in the heading to the printed specification, line 7, for "10 Claims." read -- 6 Claims. --.

Signed and sealed this 3rd day of October 1961.

(SEAL)
Attest:

ERNEST W. SWIDER
Attesting Officer

DAVID L. LADD
Commissioner of Patents

USCOMM-DC